United States Patent [19]

Jiang

[11] Patent Number: 5,774,471
[45] Date of Patent: Jun. 30, 1998

[54] MULTIPLE LOCATION REPAIR WORD LINE REDUNDANCY CIRCUIT

[75] Inventor: Yong H. Jiang, Milpitas, Calif.

[73] Assignee: Integrated Silicon Solution Inc., Santa Clara, Calif.

[21] Appl. No.: 767,797

[22] Filed: Dec. 17, 1996

[51] Int. Cl.$^6$ ...................................................... G06F 11/00
[52] U.S. Cl. ............................................................ 371/10.3
[58] Field of Search ................................. 371/10.3, 21.1, 371/21.6, 40.1, 40.3; 360/201, 200, 230.03

[56] References Cited

U.S. PATENT DOCUMENTS

| | | | |
|---|---|---|---|
| 5,563,820 | 10/1996 | Wedo et al. .............................. | 365/63 |
| 5,579,326 | 11/1996 | McClure .................................... | 371/61 |

*Primary Examiner*—Vincent P. Canney
*Attorney, Agent, or Firm*—Douglas J. Crisman; Flehr Hohbach Test Albritton & Herbert LLP

[57] ABSTRACT

A multi-location word line repair circuit is described that can be employed in a static memory including a plurality of sub-arrays responsive to respective sets of global word lines (GWL). Included in the repair circuit is a redundant word line (WL) decoder that stores and subsequently decodes the address of a defective global word line to be repaired. A selector circuit coupled to the redundant WL decoder is activated whenever the decoder decodes the stored address of the defective GWL from the memory address lines. When this occurs, the selector circuit activates at least one redundant global word line to repair the defective global word line within a selected group of global word lines that can include any combination of the respective sets of GWLs that are provided to the plurality of sub-arrays. To prevent the defective GWL from interfering with a memory operation being performed by the substitute RWL, a deselector circuit disables the defective global word line within the selected group of word lines.

6 Claims, 7 Drawing Sheets

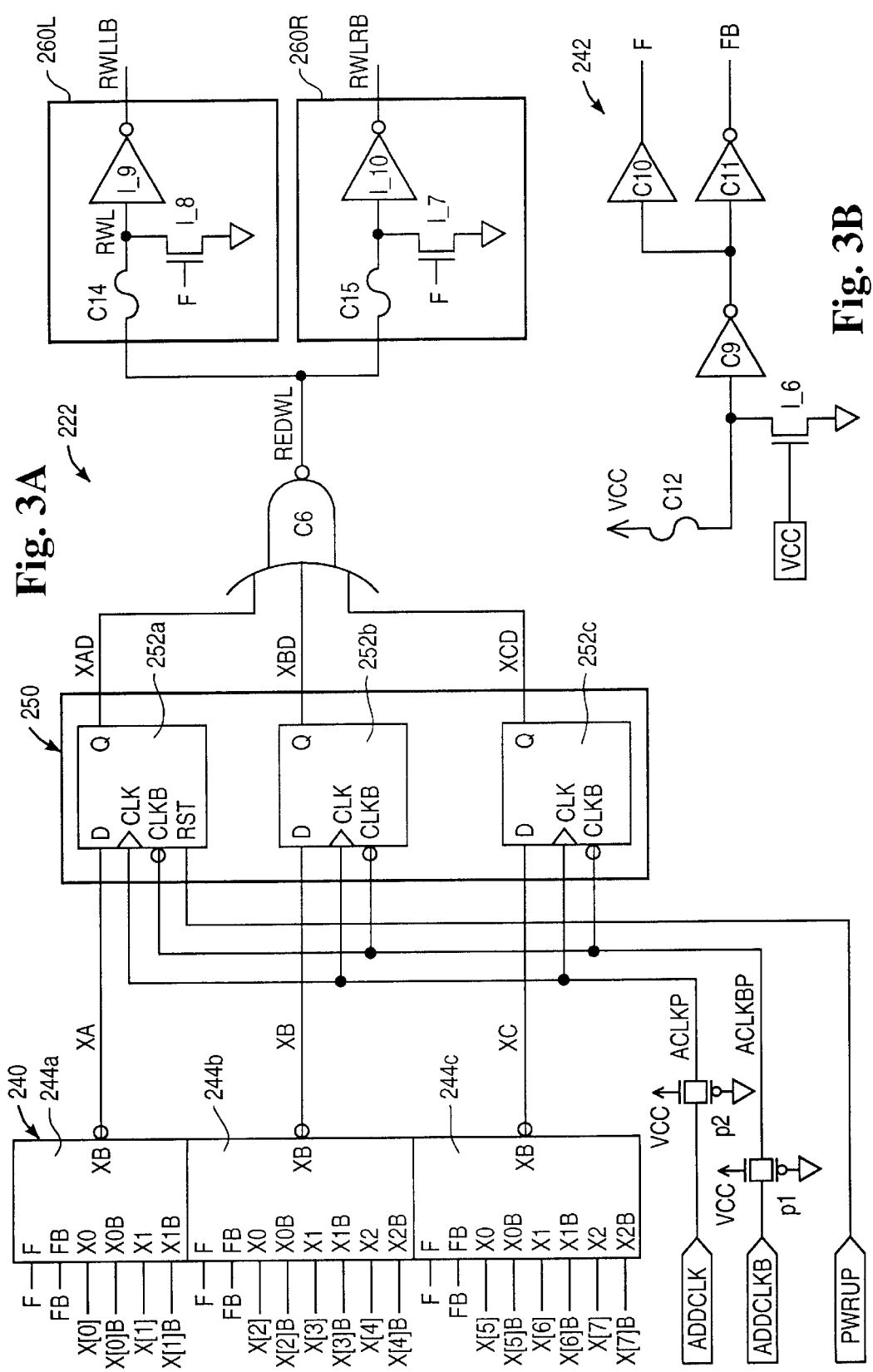

MULTIPLE LOCATION REPAIR WORD LINE REDUNDANCY CIRCUIT

BACKGROUND OF THE INVENTION

Referring to FIG. 1, there is shown a block diagram of a conventional static random access memory (RAM) 110.

The static memory 110 includes a memory array 112, an address decoder 114, a control circuit 116, an input/output (I/O) data circuit 118 and column I/O circuitry 120. The memory 110 operates in response to external signals provided by a controlling device 122, such as a microprocessor.

The principle of operation of static memories, such as the memory 110, is well known and therefore is only briefly described herein. The controller 122 initiates a memory operation by asserting a chip enable signal 101 and supplying address signals A0–AN (corresponding to $2^{N+1}$ memory locations) designating the address of a memory location where the operation is to be performed. If the memory operation is a write operation, the controller 122 supplies the data to be written to the addressed memory location via the bi-directional input/output lines I/O0–I/OK (corresponding to K+1 bit memory words). If the memory operation is a read operation, the stored information from the addressed location is read out from the same bi-directional input/output lines I/O0–I/OK. The memory 110 also provides connections for external power supply (VCC) and ground (GND) signals.

The heart of the memory 110 is the memory array 112, which consists of static memory cells, each capable of storing one bit of data, arranged in rows and columns. In the conventional manner, all of the cells in one row are energized for a memory operation (either a read or a write) by a word line WL uniquely associated with that row. A memory operation cannot be performed unless the word line associated with the target row of cells is activated.

At least a subset of the cells in a row (typically all of the cells that store data for one memory word) can be accessed simultaneously for a given memory operation via the bit lines BL. When the memory operation is a read, the bit lines BL are coupled to sense amplifiers in the column I/O 120 that "sense" the data stored in the corresponding cells of the row whose word line WL is active. When the memory operation is a write the bit lines BL carry the signals used to program the corresponding cells of the row associated with the active word line.

The control circuitry 116 controls the other blocks of the memory 110 in response to the chip enables 101. Depending on the operation to be performed, the control circuitry issues the appropriate control signals 117a, 117b to the decoder 114 and the I/O data circuit 118, respectively.

Regardless of whether the memory operation is a write or a read, the decoder 114 decodes the address signals A0–AN and activates the word line WL of the row that includes the memory word that is the target of the current memory operation.

If the operation is a write, the I/O data circuitry 118 buffers the input data signals I/O0–I/OK and outputs the buffered data to the column I/O 120 via the bi-directional data bus 119. The column I/O 120 then latches the input signals in parallel onto the corresponding bit lines BL0–BLK. The signals on the bit lines BL0–BLK are used to program the cells composing the word whose word line was activated for the current operation by the decoder 114.

If the operation is a read, sense amplifiers (SA) in the column I/O 120 sense the signals on the respective bit lines BL, convert the sensed signals into binary (e.g., high or low) voltages that represent the programmed state of the addressed word and output the word's bit values to the I/O data circuit via the bi-directional bus 119. The output data are buffered by the I/O data circuit 118 and latched onto the bi-directional data lines I/O0–I/OK for use by the controller 122.

Given the size and complexity of static memories, there is a good chance that at least some of the word lines and/or cells are defective following the wafer processing steps during which the memory is defined. To prevent these practically unavoidable word line and/or cell defects from rendering an entire static memory unusable, many memories include circuitry to repair defective word lines. Conventional word line repair circuitry includes several redundant word line circuits (including a redundant word line and an associated row of memory cells), each of which has an address that can be mapped to the location of a single defective word line to be repaired. Once the redundant word line circuit's address has been re-mapped, it becomes a substitute for the defective word line, enabling memory operations directed to the affected row to proceed.

SUMMARY OF THE INVENTION

In summary, the present invention is an improved word line redundancy circuit. More particularly, the present invention improves on conventional word line repair circuits by repairing multiple word line locations rather than a single word line location.

In a preferred embodiment of the present invention, the memory array 112 is configured with two independent sub-arrays, referred to as a left sub-array and a right sub-array. Each sub-array is coupled to a respective set of global word lines (GWL) provided by the decoder 114. Within the array 112, each GWL is decoded to one of two local word lines (LWL) that interact with the addressed memory cells to carry out a memory operation. Either, or both, sides of the array 112 can include a bad memory cell or GWL. The present invention is a system for repairing either type of defect at the GWL level (i.e., by replacing with a redundant word line the GWL that is bad or that is associated with a bad cell).

In the preferred embodiment, each set of the GWLs covers the same X address space, which implies that any X address can be decoded to two global word lines, a left GWL (GWLL) coupled to the left sub-array and a right GWL (GWLR) coupled to the right sub-array. The present invention takes advantage of this fact to provide redundant word line (RWL) repair circuitry whose redundant elements are independently capable of replacing a GWLL or GWLR to repair a GWL or cell for either or both sub-arrays.

Specifically, the preferred embodiment includes a multilocation word line repair circuit implemented within the decoder 114 that maps a RWL to the same X address as a GWL or cell to be repaired. Then, when a memory address is received by the decoder 114 that is the same as the repair address the repair circuit activates the substitute RWL to perform the memory operation. The word line repair circuit also disables the GWL associated with the repair address so that it does not interfere with the memory operation performed using the RWL. The repair can be selectively performed on a GWLL or a GWLR.

BRIEF DESCRIPTION OF THE DRAWINGS

Additional objects and features of the invention will be more readily apparent from the following detailed description and appended claims when taken in conjunction with the drawings, in which:

FIG. 3A is block diagram showing additional details of a redundant word line circuit 222 of FIG. 2;

FIG. 3B is a schematic diagram of the enabling circuit included within the redundant word line circuit 222 that provides the F and FB signals shown in FIG. 3A;

DESCRIPTION OF THE PREFERRED EMBODIMENT

Figure 1:
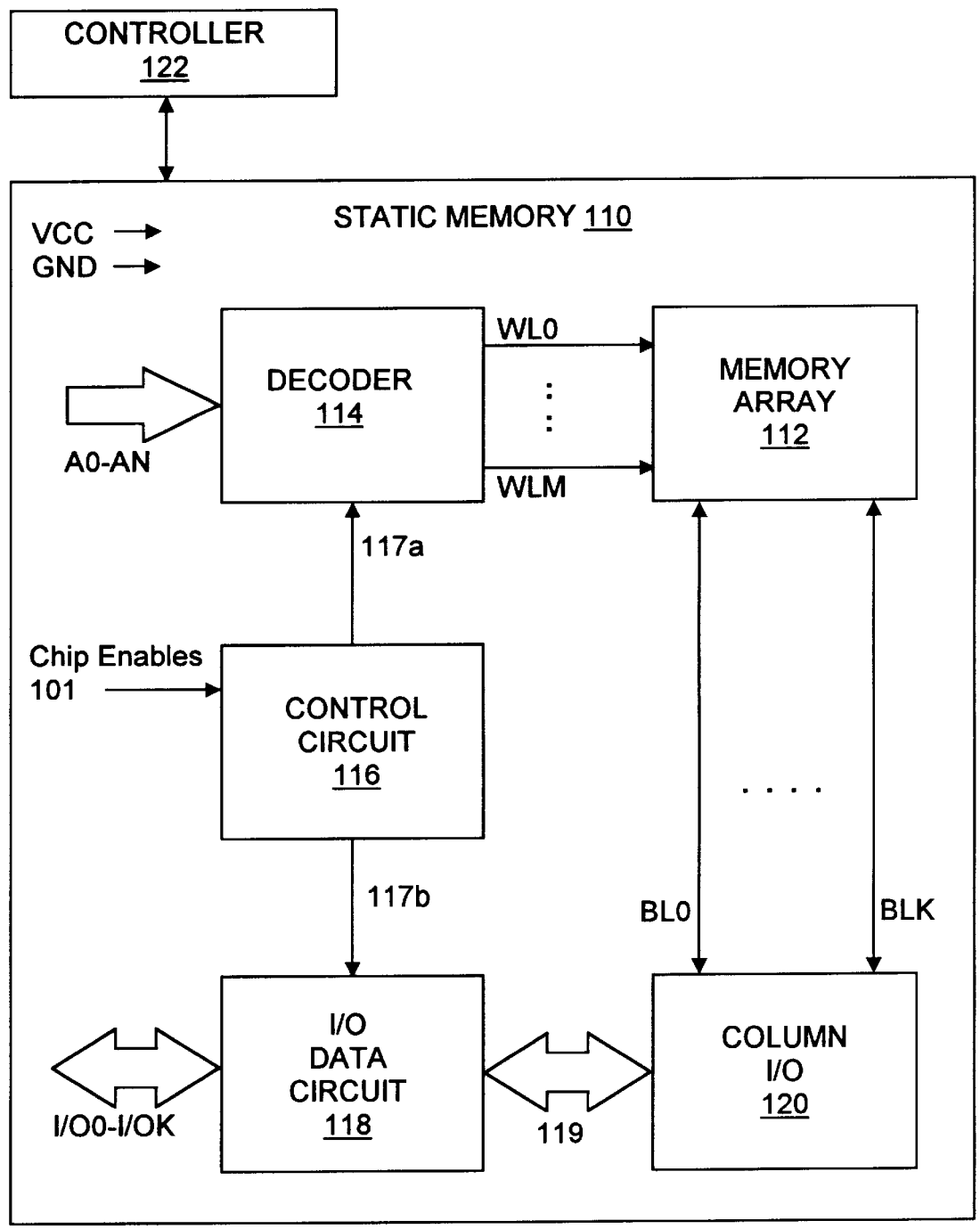
FIG. 1 is a block diagram of a static memory in which the present invention can be practiced.
Figure 2:
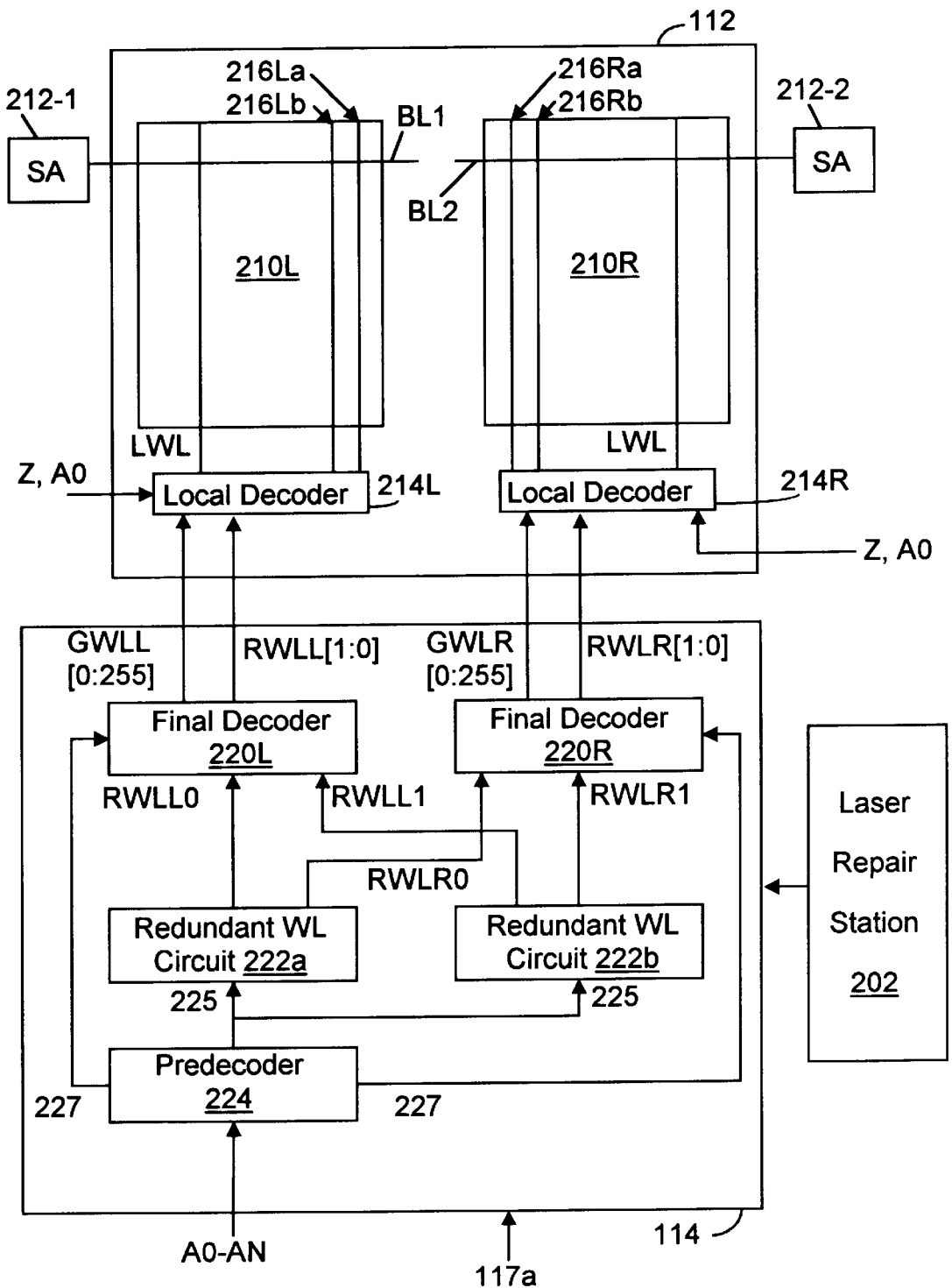
FIG. 2 is a block diagram showing additional details of the array 112 and the decoder 114 of FIG. 1.

FIG. 2 is a block diagram showing additional details of the array 112 and the decoder 114 of FIG. 1. The array 112 consists of two sub-arrays, a left sub-array 210L and a right sub-array 210R. Memory locations in the sub-arrays 210L, 210R are accessed in the conventional manner using respective local word lines (LWL) and bit lines BL1, BL2; stored data is read out by sense amplifiers 212-1, 212-2 coupled to the bit lines BL1, BL2. Note that both subarrays share the same address space and, consequently, are accessed simultaneously for a given memory operation. This does not cause any memory access difficulties as the subarrays 210L, 210R are independent; i.e., they do not share bit lines BL or sense amplifiers 212.

In the preferred embodiment, respective pairs of LWLs (and their respective rows of memory cells) are mapped to a single GWL or RWL. A local decoder 214 activates a particular LWL in response to the global word line (GWL) or redundant word line (RWL) activated by the decoder 114 and the state of the least significant address bit A0. That is, each A0 value selects a different one of the two LWLs associated with the active GWL or RWL. The local decoders 214 also respond to the same block select signal (Z), which indicates whether the block of memory that includes both sub-arrays 210L, 210R is to be activated for a memory operation.

Each subarray 210 includes two pairs of redundant local word lines 216a, 216b. Each pair of redundant local word lines is accessed only when the corresponding redundant WL circuit 222 is programmed and the asserted address matches the programmed WL address.

The decoder 114 includes a predecoder 224, redundant WL circuits 222a, 222b and final decoders 220L, 220R. The decoder 114 receives control signals 117a from the control circuit 116 and address signals A0–AN designating the target location for a pending memory operation. The predecoder 224 predecodes the addresses A0–AN and generates corresponding predecoded signals 227 that are output to the left and right final decoders 220L, 220R. The predecoder 224 also passes the address 225 for the current memory operation to the left and right redundant word line (WL) circuits 222a, 222b, which enables a GWL repair to be made at either location.

The redundant WL circuits 222a, 222b are employed when it has been determined that a die on which a static memory has been defined includes one or more defective global word lines and/or cells (i.e., a bad word line conductor or defective memory cells energized by local word lines associated with particular global word lines). This determination is made during a wafer sort operation that is performed on memory wafers in which test vectors are applied to each die on the wafer. Following the wafer sort step, defective locations are marked and the defective wafers are sent off to a laser repair station 202, which, in accordance with the present invention, disables the defective GWL (and its associated memory cell rows) and repairs the defective GWL. As is described below, the laser repair station 202 performs the repair in conjunction with the redundant WL circuits 222 and the final decoders 220.

When it is determined that the GWL associated with the particular physical address X is defective, one of the redundant word line circuits 222a, 222b is employed to repair the defective GWL for one or both of the sub-arrays 210L, 210R. A redundant word line circuit 222 makes the repair by remapping the address X associated with a defective GWL to an appropriate redundant word line RWL. In particular, the redundant WL circuit 222a effects a GWL repair for the left/right sub-array 210 by enabling left/right redundant word lines RWLL0/RWLR0 (the index "0" identifies the particular defective GWLs repaired by the circuit 222a). Similarly, the redundant WL circuit 222b effects a GWL repair on the left/right side of the array 112 by enabling left/right redundant word lines RWLL1/RWLR1 (the index "1" identifies the particular defective GWLs repaired by the circuit 222b). Thus, each redundant circuit 222 can repair a respective GWL associated with a particular address X for both the left and right arrays 210L, 210R. Each redundant circuit 222 is used to repair a defective GWL associated with a different respective address X.

The left side redundant word lines RWLL0, RWLL1 (collectively, RWLL[1:0]) are coupled to the left side of the array 112 via the left final decoder 220L and the right side redundant word lines RWLR0, RWLR1 (collectively, RWLR[1:0]) are coupled to the right side of the array 112 via the right final decoder 220R. The final decoders 220 also receive the predecoded addresses 227 output by the predecoder 224. In normal operation, the final decoders 220 decode the predecoded addresses 227 to a particular GWL to be activated on their respective side of the memory array 112. I.e., the final decoders 220L and 220R respectively control the left and right global word lines GWLL and GWLR. When one of the redundant repair circuits 222 has repaired a defective GWL on its side of the array 112, the respective final decoder 220 disables the defective GWL so it won't interfere with memory operations directed to the affected address X. Because each repaired global word line GWL is associated with two local word lines LWL and each redundant WL circuit 222 is able to repair 2 GWLs (one per side, each sharing the same X address), each redundant WL circuit 222 is able to reclaim memory locations accessed via the four LWLs corresponding to the same X address. In fact, any time a GWL repair is made, the two LWLs mapped to the repaired GWL's address X are both repaired. Additional details of the redundant WL circuits 222 are now described in reference to FIGS. 3A–3C.

FIG. 3A is a block diagram of the redundant word line circuit 222, which includes a decoder/storage unit 240, a register set 250, a NOR gate C6, two fuses C14, C15 and two inverters I_9, I_10. Also included in the redundant word line circuit 222 are pass transistor structures p1, p2 and n-channel pull down transistors I_8, I_9.

The decoder/storage unit 240 stores the address X of a defective GWL to be repaired and then decodes that address X from the address signals 225 provided by the predecoder 224. The decoder/storage unit 240 is responsive to a set of eight address signals X[7:0] that correspond to eight bits of the address signals 225 and a complementary set of eight "X-bar" signals X[7:0]B. For example, given a set of address signals X[7:0] equaling {11000101}, the corresponding set of X-bar signals X[7:0]B equals {00111010}. The decoder/storage unit 240 also receives complementary signals F and F-bar (FB), which enable the decoder/storage unit 240 to store and decode a particular address X when the F signal is at the logic high level and the FB signal is at the logic low level.

The F and FB signals are provided by the enabling circuit 242 of FIG. 3B, which includes a fuse C12, a pull down n-channel transistor I_6, two inverters C9 and C11 and a buffer C10. When the laser repair station 202 identifies a defective word line to be repaired, it causes the address X of the defective GWL to be placed on the address lines A0–AN and simultaneously blows the fuse C12, which disconnects the input of the first inverter C9 from the VCC node. This enables the relatively small transistor I_6, whose gate is coupled to the VCC node, to pull down the input to the inverter C9, which subsequently causes the buffer C10 to issue a high F signal and the inverter C11 to issue a low FB signal. The high F and low FB signals in turn activate the decoder/storage unit 240 to compare the address X of the defective word line to be repaired with an asserted 8-bit address X[7:0]. When the fuse C12 (FIG. 3B) is intact, the input of the inverter C9 is coupled to the VCC node and, as a result, the inverter C9 outputs a low signal that generates a low F signal and a high FB signal, which do not energize the decoder/storage unit 240.

Referring again to FIG. 3A, the decoder/storage unit 240 includes three sub-decoders 244a, 244b and 244c that respectively store and decode a portion of the 8-bit address X[7:0]. In particular, the sub-decoder 244a stores and decodes the first two bits X[1:0] of the address, the sub-decoder 244b stores and decodes the next three bits X[4:2] and the sub-decoder 244c stores and decodes the last three bits of the address X[7:5]. Each of the sub-decoders 244 has inputs X(i-1)–X0 for i uncomplemented signals (where i is an integer identifying the number of address bits that can be decoded by that sub-decoder 244) and corresponding complemented inputs X(i-1)B–X0B. For example, the sub-decoder 244a has X0, X0B, X1 and X1B inputs that are coupled to the address signals X[0], X[0]B, X[1] and X[1]B and the sub-decoder 244a has X0, X0B, X1, X1B, X2 and X2B inputs that are coupled to the X[2], X[2]B, X[3], X[3]B, X[4] and X[4]B address signals. Each of the sub-decoders 244 is responsive to the F and FB signals and operates in the same manner, which is now described in reference to FIG. 3C.

Figure 3C:
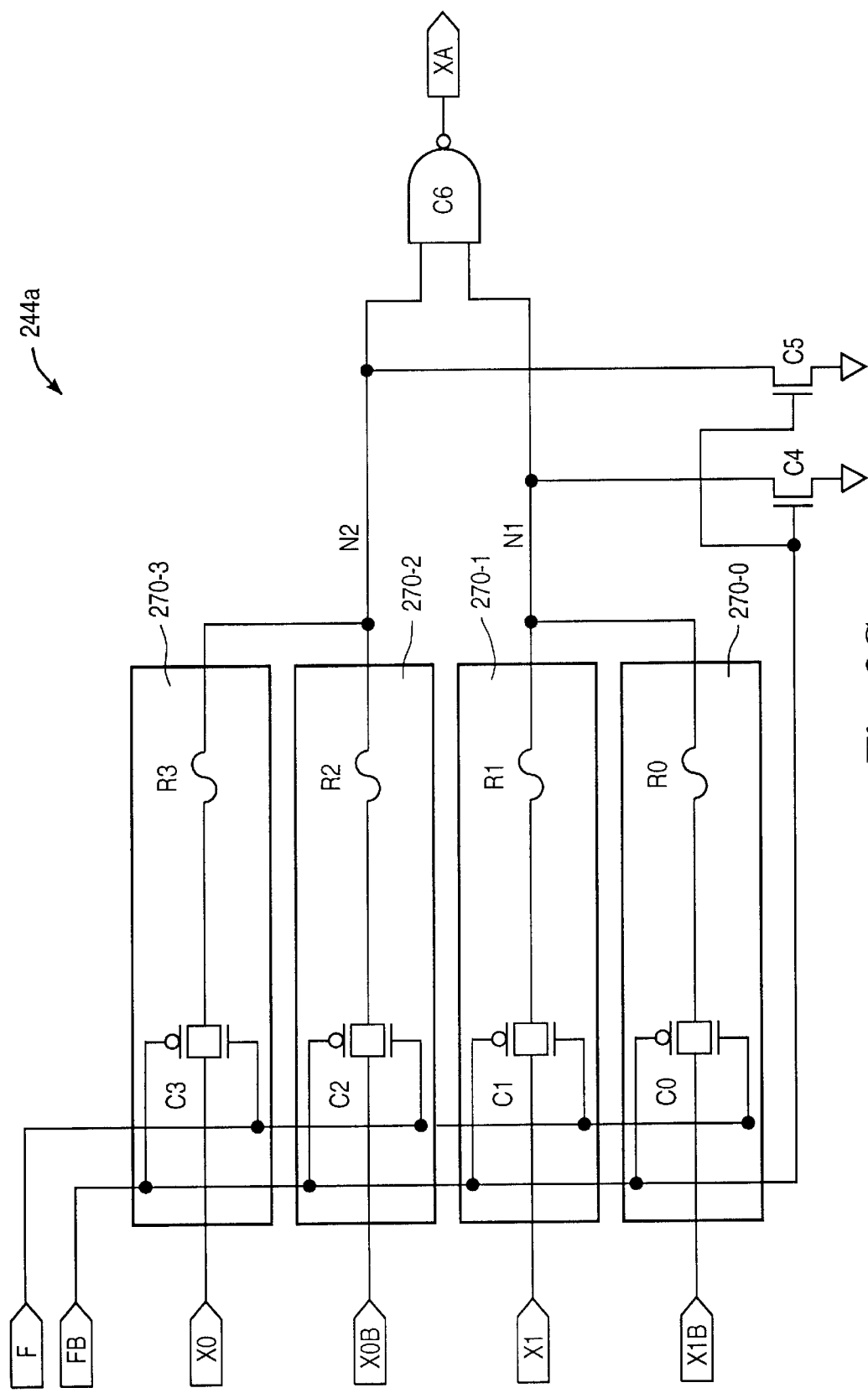
FIG. 3C is a schematic diagram of the sub-decoder 244a used within the decoder/storage unit 240 of FIG. 3A.

FIG. 3C is a circuit diagram of the 2-bit decoder 244a, which includes four sets of decoding structures 270-0, 270-1, 270-2, 270-4. Each of the structures 270 includes a pass structure (e.g., C0, C1, C2 or C3) and a fuse (e.g., R0, R1, R2, R3) that makes a connection when it is blown and otherwise remains open. The 2-bit decoder 244a also includes a NOR gate C6 that provides an output signal XA that is low/active only when its two inputs N2 and N3 are high. Each of the pass structures C0, C1, C2, C3 is enabled for address storage and decoding when the F and FB signals are high and low, respectively. When it is time for the decoder 244a to store its two bits of the address X, a subset of the fuses R0, R1, R2, R3 are blown by the laser repair station 202 so that the N2 and N3 signals go high (and the output XA low) only when the inputs X0, X0B, X1, X1B match the corresponding values X[0], X[0]B, X[1], X[1]B of the address X to be decoded. For example, if the bits X[1:0] of the defective address X equal {01}, the fuses R3 (coupled to X[1]B) and R0 (coupled to X[0]) are blown. This means that only when X[1] is low (corresponding to X[1]B high) and X[0] is high will two high signals N2 and N3 be input to the NOR gate C6, resulting in a low/active output signal XA.

The circuit 244a also includes two pull-down transistors C4 and C5, whose gates are coupled to the FB signal. These pulldowns ensure that, whenever FB is high, indicating that the decoder/storage unit 240 is to be disabled, N2 and N3 are pulled down and the NAND gate output XA is high/inactive.

The circuits 244b and 244c are constructed similarly to the circuit 244a except they each include six decoding structures corresponding to their six inputs (i.e., three address bits and their complements) and a three-input NAND gate with three pulldowns similar to the pulldowns C4, C5 of FIG. 3C. As with the circuit 244a, the circuits 244b, 244c respectively indicate with low/active signals on their outputs XB, XC that their subset of the address X matches the address bits stored therein of the defective GWL to be repaired.

Referring again to FIG. 3A, the three decoder outputs XA, XB, XC are respectively coupled to the D inputs of the DQ flip flops 252a, 252b, 252c that compose the register 250. Each flip-flop is clocked by the clock signal ACLKP (formed from the address clock ADDCLK) and its complement ACLKPB (formed from the address clock complement ADDCLKB). The ADDCLK signal is triggered shortly after each address transition. The output signal XAD of the flip-flop 252a is set high by the assertion of a PWRUP signal upon power-up. This ensures that the output REDWL of the NOR gate C6 to which the XAD signal is coupled goes low/inactive and that neither of the redundant word lines that can be provided by the redundant WL circuit 222 is activated. The ADDCLK, ADDCLKB and PWRUP signals are provided by circuitry outside the scope of this discussion. Upon a high to low transition of the clock signal ACLKB (and high to low transition of the ACLKPB signal), the flip-flops 252a, 252b, 252c respectively output to the NOR gate C6 synchronized signals XAD, XBD, XCD at the same signal level as the inputs XA, XB, XC. I.e., each of the signals XAD, XBD, XCD is low only when the stored address X has been decoded from the input 225.

The NOR gate C6 generates an output REDWL (standing for redundant word line) that is high only when all of the inputs XAD, XBD, XCD are low, which is the case when the address on the address lines 225 matches the address X stored in the decoder/storage unit 240. The REDWL signal is coupled to two output circuits 260L, 260R, each consisting of a fuse (C14, C15), pull-down transistor (I_8, I_7) and an inverter (I_9, I_10). The inverters' respective outputs RWLLB (standing for left redundant word line-bar), RWLRB (standing for right redundant word line-bar), are the complements of the redundant word lines RWLL, RWLR coupled respectively to the left final decoder 224L and the right final decoder 224R (FIG. 2). As with the other fuses incorporated in the preferred embodiment, the fuses are controlled by the laser repair station 202.

The gates of the pulldown transistors I_8, I-7 are coupled to the F signal, which, as described above, is asserted when a redundant WL circuit 222 is enabled. The fuses C14, C15 make a connection when they are not blown, which only occurs when the corresponding redundant WL circuit 222 is enabled. The transistors I_8, I_7 are very weak devices that can pull down the inverter I_9, I_10 inputs only when their respective fuses C14, C15 are blown. These devices are too small to affect the logic state on the REDWL node when their respective fuses are not blown. Thus, if the circuit 222 has been enabled and a fuse C14, C15 has been blown, the output of the inverter I_9, I_10 corresponding to the blown fuse is guaranteed to be high/inactive (due to the effect of the energized pulldown). On the other hand, if a fuse C14, C15 has not been blown and the circuit 222 has been enabled, the output of the inverter I_9, I_10 coupled to the intact fuse will be low/active whenever the REDWL signal is high (i.e., when the stored address matches the asserted address). In this way, a redundant word line can be provided to repair a GWL for the right sub-array 210R (by not blowing the fuse C15) or for the left sub-array 210L (by not blowing the fuse C14) or for both sub-arrays (by not blowing both fuses C14, C15).

Figure 4A:
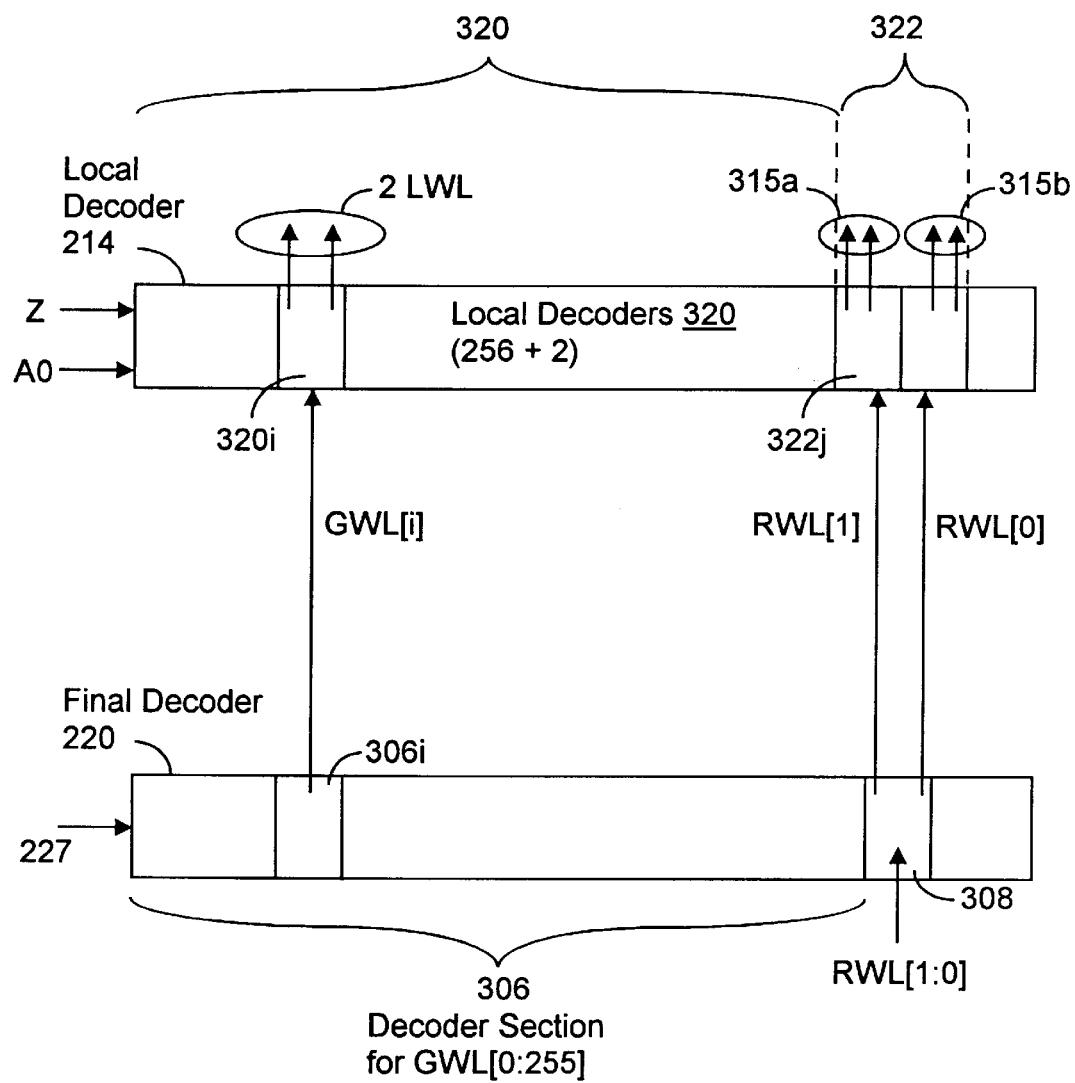
FIG. 4A illustrates the interconnections between the final decoder 220 and the local decoder 214.

Each circuit 222a, 222b can provide redundant word lines for defective global word lines with different addresses X based on the selective programming of their respective decoder/storage units 240 and the circuit's respective F signal. For example, the circuit 222a can be enabled to detect and repair a defective GWL address X1 by virtue of the laser repair station 202 blowing the fuse C12 in the circuit 222a (activating the F signal coupled to the circuit 222a) and blowing the decoder/storage unit fuses corresponding to the address X1. The circuit 222b is programmed and enabled (or not enabled) independently of the circuit 222a by the programming of its respective fuses. Referring to FIG. 4A, there is shown a block diagram illustrating the interconnections between the final decoder 220 and the corresponding local decoder 214 for one sub-array 210. In FIG. 4A, the RWLs are denoted "RWL[1:0]", which is a generic expression that refers to the left RWLs RWLL[1:0] or the right RWLs RWLR[1:0]. By the same convention, the global word lines are generically denoted "GWL". The final decoder 220 includes a GWL decoder section 306 and a RWL section 308. The GWL decoder section 306 includes one GWL decoder unit 306i for each GWL. Thus, in the preferred embodiment, there are 256 GWL decoder units 306i. Each decoder unit 306i decodes the predecoded signals 227 and asserts its global word line GWL[i] when the decoded signals 227 designate that GWL[i]. Each GWL[i] is coupled to a corresponding local decoder unit 320i, which, based on the state of the low-order X address bit A0, further decodes the global word line GWL[i] to one of the two LWLs mapped to that GWL[i]. There is one local decoder unit 320i per global word line GWL[i]; thus, in the preferred embodiment the local decoder 214 includes 256 local decoder units 320i, each providing 2 LWLs. Note that, in the preferred embodiment, each local decoder unit 320i includes 2 decoders, each of which decodes the address of one of the LWLs output by that local decoder unit 320i.

The final decoder's RWL section 308 does little more than buffer the RWL[1:0] and separately output them to respective local decoder units 322j. Each local decoder unit 322j decodes a respective RWL to one of its two corresponding LWLs. I.e., the RWL[1] is decoded to two LWLs 315a and the RWL[0] is decoded to two LWLs 315b. The local decoders 322j are provided by the local word line decoder 214 in addition to the decoders 320i, described above. Thus, the local decoder 214 includes a total of 258 local decoder units (256 GWL units 320 and 2 RWL units 322) that drive a total of 516 LWLs (512 LWLs for the GWL[0:255] and 4 LWLs for the RWL[1:0]). For each RWL that is mapped to an address X, the corresponding GWL is disabled. This disabling function is performed in the final detector units 306 and is now described in reference to FIGS. 4B and 5.

Figure 4B:
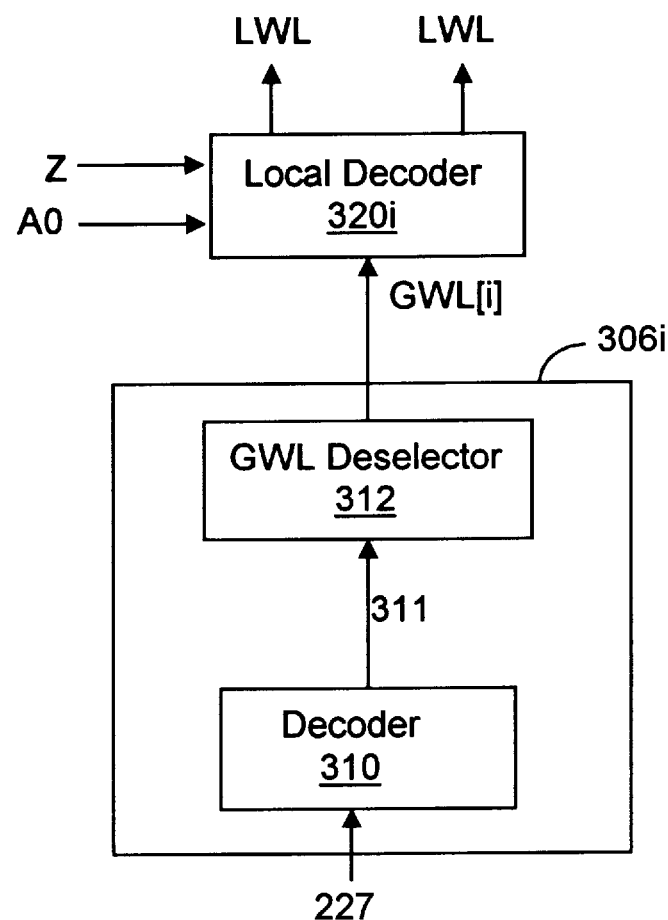
FIG. 4B is a block diagram of one final decoder unit 306i and a corresponding local decoder unit 320i.

Referring to FIG. 4B, there is shown a block diagram of the GWL final decoder unit 306i, including a decoder 310 and a GWL deselector 312, and a corresponding local decoder unit 320i. The decoder 310 decodes the predecoded signals 227 for a particular GWL[i] as described in reference to FIG. 4A and energizes the signal 311 when the signals 227 decode to that GWL[i]. In normal operation, the GWL deselector 312 responds to the energized signal 311 by activating the corresponding word line GWL[i]. However, if that word line GWL[i] has been repaired, the deselector 312 disables the GWL[i] and does not respond to the signal 311. This disabling prevents signals on the defective GWL from interfering with the memory operation being executed using its stand-in RWL.

Figure 5:
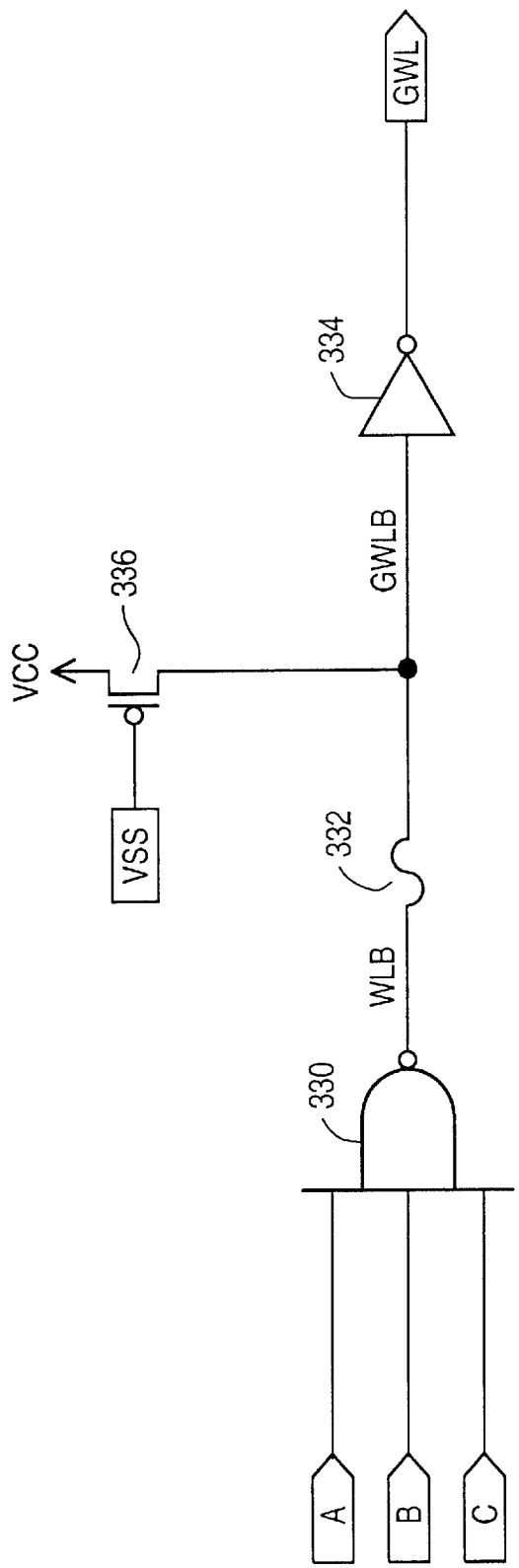
FIG. 5 is a circuit diagram of the GWL deselector 312 of FIG. 4B.

Referring to FIG. 5, there is shown a circuit diagram of a portion of the GWL decoder unit 306i. This circuit portion includes a NAND gate 330 that is responsive to three signals A, B, C selected from the predecoded address signals 227. The signals A, B, C are decoded by the NAND gate to a particular GWL when all of those signals are asserted. This portion of the circuit corresponds to the decoder 310 of FIG. 4. The output WLB of the NAND gate 330 is coupled to an output circuit that includes a fuse 332 controllable by the laser repair station 202 with an output GWLB coupled to a pull-up transistor 336 and an inverter 334 whose output provides the GWL. If the particular GWL is defective, the fuse 332 is blown, which enables the pull-up transistor 336, whose gate is coupled to VSS (high voltage), to pull up the input of the inverter, which in turns drives low (i.e., disables) the word line. When the fuse 332 is not blown, a low/active output WLB from the NAND gate 330 drives the input of the inverter 334 low in spite of the action of the pullup 336. This active input is reflected by a high output on the corresponding GWL.

While the present invention has been described with reference to a few specific embodiments, the description is illustrative of the invention and is not to be construed as limiting the invention. Various modifications may occur to those skilled in the art without departing from the true spirit and scope of the invention as defined by the appended claims.

For example, an alternative embodiment can be implemented within a memory array 112 with N sub-arrays (N being an integer greater than 2), where each redundant WL circuit 222 is configured to repair between 1 and N of the defective global word lines coupled to the respective sub-arrays that correspond to the same input address. Other alternative embodiments include but are not limited to word line repair systems encompassing more than two redundant WL circuits 222 and memory arrays 112 where each global word line is mapped to 1, 2 or more LWLs. Finally, the present invention is intended to encompass WL repair systems that employ other than laser technology to blow fuses and also to WL repair systems that can make WL repairs after the memory to be repaired has been packaged.

What is claimed is:

1. For use in a static memory including first and second sub-arrays responsive respectively to first and second sets of global word lines, a multilocation word line repair circuit, comprising:

a storage circuit configured to store address of a defective global word line, the stored address corresponding to a global word line in each of the first and second sets;

a redundancy decoder configured to decode the stored address from memory address lines;

a selector circuit configured to activate upon decoding by the redundancy decoder of the stored address at least one redundant global word line to repair the defective global word line within a group of global word lines selected from:
(a) the first set of global word lines,
(b) the second set of global word lines, or
(c) the first and second sets of global word lines; and
a deselector circuit to disable the defective global word line within the selected group of word lines.

2. The word line repair circuit of claim 1, wherein the selector circuit comprises:

a first redundant word line capable of being coupled to the first set of global word lines;

a first fuse that enables coupling of the first redundant word line and the first set of global word lines;

a second redundant word line capable of being coupled to the second set of global word lines; and a second fuse that enables coupling of the second redundant word line and the first set of global word lines;

such that the defective word line is repaired within the first set of global word lines by operating the first fuse to enable the coupling of the first redundant word line and the first set of global word lines; and the defective word line is repaired within the second set of global word lines by operating the second fuse to enable the coupling of the second redundant word line and the second set of global word lines.

3. The word line repair circuit of claim 1, wherein the deselector circuit comprises disabling fuses configured to decouple the defective word line from the selected group of global word lines;

such that the deselector circuit decouples the defective word line from the first set of global word lines by operation of a first disabling fuse and decouples the defective word line from the second set of global word lines by operation of a second disabling fuse.

4. The word line repair circuit of claim 1, wherein the word line repair circuit comprises a first word line repair circuit included in a redundant word line repair system that further includes a second word line repair circuit with a second storage element, redundancy decoder, selector circuit and deselector circuit performing as and interconnected in same manner as the storage element, redundancy decoder, selector circuit and deselector circuit of the first word line repair circuit;

the redundant word line repair circuit thereby enabling any combination of the first and second word line repair circuits to be configured to repair the same defective word line within selected group of global word lines.

5. The word line repair circuit of claim 4, wherein each of the deselectors is included in a final decoder configured to activate a global word line addressed by predecoded address signals for a respective one of the sets of global word lines, the first/second word line repair circuit including a first/second final decoder that drives the first/second set of global word lines;

each of the deselectors being connected at the output of a respective final decoder so as to disable the defective word line corresponding to the stored address within the set of global word lines driven by the respective final decoder.

6. The word line repair circuit of claim 5, wherein each of the deselector circuits comprises a disabling fuse configured to disable the defective word line driven by the respective final decoder; such that the first deselector disables the defective word line within the first set of global word lines by operation of a first disabling fuse and the second deselector disables the defective word line within the second set of global word lines by operation of a second disabling fuse.

* * * * *